US012635419B2

(12) United States Patent
Wu et al.

(10) Patent No.:  US 12,635,419 B2
(45) Date of Patent:  May 19, 2026

(54) STACKED SPIN-ORBIT TORQUE MAGNETORESISTIVE RANDOM ACCESS MEMORY

(71) Applicant: International Business Machines Corporation, Armonk, NY (US)

(72) Inventors: Heng Wu, Guilderland, NY (US); Alexander Reznicek, Troy, NY (US); Bahman Hekmatshoartabari, White Plains, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 952 days.

(21) Appl. No.: 17/480,095

(22) Filed: Sep. 20, 2021

(65) Prior Publication Data

US 2023/0089984 A1  Mar. 23, 2023

(51) Int. Cl.
| | |
|---|---|
| *H10N 50/10* | (2023.01) |
| *H10B 61/00* | (2023.01) |
| *H10N 50/01* | (2023.01) |
| *H10N 50/80* | (2023.01) |

(52) U.S. Cl.
CPC ............. *H10N 50/10* (2023.02); *H10B 61/22* (2023.02); *H10N 50/01* (2023.02); *H10N 50/80* (2023.02)

(58) Field of Classification Search
CPC ...... H10N 52/00; H10N 52/01; H10N 52/101; H10N 52/85; H10N 50/10; H10N 50/01; H10N 50/80; H10B 61/22; H10B 61/00; G11C 11/02; G11C 11/18; G11C 11/161
See application file for complete search history.

(56) References Cited

U.S. PATENT DOCUMENTS

| | | | |
|---|---|---|---|
| 9,768,229 | B2 | 9/2017 | Braganca |
| 9,830,966 | B2 | 11/2017 | Mihajlovic |
| 9,858,975 | B1 | 1/2018 | Hatcher |
| 10,333,523 | B2 | 6/2019 | Manipatruni et al. |
| 10,381,406 | B1 | 8/2019 | Jacob et al. |
| 10,381,552 | B2 | 8/2019 | Mihajlovic |

(Continued)

FOREIGN PATENT DOCUMENTS

| | | |
|---|---|---|
| CN | 106449970 B | 3/2019 |
| CN | 111489777 A | 8/2020 |

(Continued)

OTHER PUBLICATIONS

Nist, "Theory of Spin-Orbit Torque" https://www.nist.gov/programs-projects/theory-spin-orbit-torque . Feb. 7, 2020. pp. 1-5.

(Continued)

*Primary Examiner* — Davienne N Monbleau
*Assistant Examiner* — Emily Farmer
(74) *Attorney, Agent, or Firm* — Seed Intellectual Property Law Group LLP

(57) ABSTRACT

A semiconductor structure includes a bottom MTJ stack with a bottom fixed layer, a bottom barrier layer, and a bottom free layer. The semiconductor structure also includes a top MTJ stack with a top fixed layer, a top barrier layer, and a top free layer. Additionally, the semiconductor structure also includes a spin-Hall effect (SHE) rail with a dielectric, a top heavy metal layer, and a bottom heavy metal layer.

20 Claims, 10 Drawing Sheets

(56) References Cited

U.S. PATENT DOCUMENTS

| | | | |
|---|---|---|---|
| 10,411,069 B1 | 9/2019 | Jacob | |
| 10,762,942 B1 | 9/2020 | Katti | |
| 2014/0124882 A1 | 5/2014 | Khalili Amiri et al. | |
| 2015/0213869 A1* | 7/2015 | Wu | G11C 11/161 |
| | | | 365/154 |
| 2017/0365777 A1 | 12/2017 | Mihajlovic et al. | |
| 2019/0259809 A1* | 8/2019 | Jacob | H10N 52/80 |
| 2020/0075670 A1 | 3/2020 | Lin | |
| 2020/0136016 A1* | 4/2020 | Lin | H01F 41/307 |
| 2020/0152700 A1 | 5/2020 | Lee et al. | |
| 2020/0161542 A1 | 5/2020 | Ahn et al. | |
| 2021/0257543 A1 | 8/2021 | Wu et al. | |
| 2021/0327960 A1* | 10/2021 | Xiao | H10N 50/85 |

FOREIGN PATENT DOCUMENTS

| | | |
|---|---|---|
| CN | 111640769 A | 9/2020 |
| EP | 4406381 A1 | 7/2024 |
| JP | 2017-510016 A | 4/2017 |
| JP | 2019-036596 A | 3/2019 |
| JP | 2020-043289 A | 3/2020 |
| JP | 2024-531525 A | 8/2024 |
| WO | 2016/011435 A1 | 1/2016 |
| WO | 2023/041267 A1 | 3/2023 |

OTHER PUBLICATIONS

Sergio O. Valenzuela, "Spin Hall effect and Spin-Orbit Torques" Novel Frontiers in Magnetism, Benasque 2014. pp. 1-25.

International Searching Authority, "Notification of Transmittal of the International Search Report and the Written Opinion of the International Searching Authority, or Declaration," Patent Cooperation Treaty, Jan. 12, 2023, 24 pages, International Application No.—PCT/ EP2022/072616.

Qi Xuelei et al: "A Dual-Bit Spin-Based Analog-to-Digital Converter With Double-Check Estimation", IEEE Magnetics Letters, IEEE, USA, vol. 12, Sep. 8, 2021 (Sep. 8, 2021), pp. 1-5, XP011884775, ISSN: 1949-307X, DOI: 10.1109/LMAG.2021.3110485 [retrieved on Oct. 26, 2021].

Shreya Sonal et al: "Computing-in-Memory Architecture Using Energy-Efficient Multilevel Voltage-Controlled Spin-Orbit Torque Device", IEEE Transactions on Electron Devices, IEEE, USA, vol. 67, No. 5, Mar. 24, 2020 (Mar. 24, 2020) , pp. 1972-1979, XP011784566, ISSN: 0018-9383, DOI:10.1109/TED.2020. 2978085 [retrieved on Apr. 22, 2020].

Garello et al., "SOT-MRAM 300mm integration for low power and ultrafast embedded memories", Oct. 2018, 03 pages, https://www.researchgate.net/publication/328494846_SOT-MRAM_300mm_integration_for_low_power_and_ultrafast_embedded_memories.

Japan Patent Office, "Notice of Reasons for Refusal" Dec. 23, 2025, 14 Pages, JP Application No. 2024-513755.

* cited by examiner

700

800

900

1000

1300

526
522
518
514
1336
510
728
506
502

1134
524
520
516
512
508
728
830
504

1400

526
522
518
514
1336
510
728
506
502

1134
524
520
516
1438
512
508
728
830
504

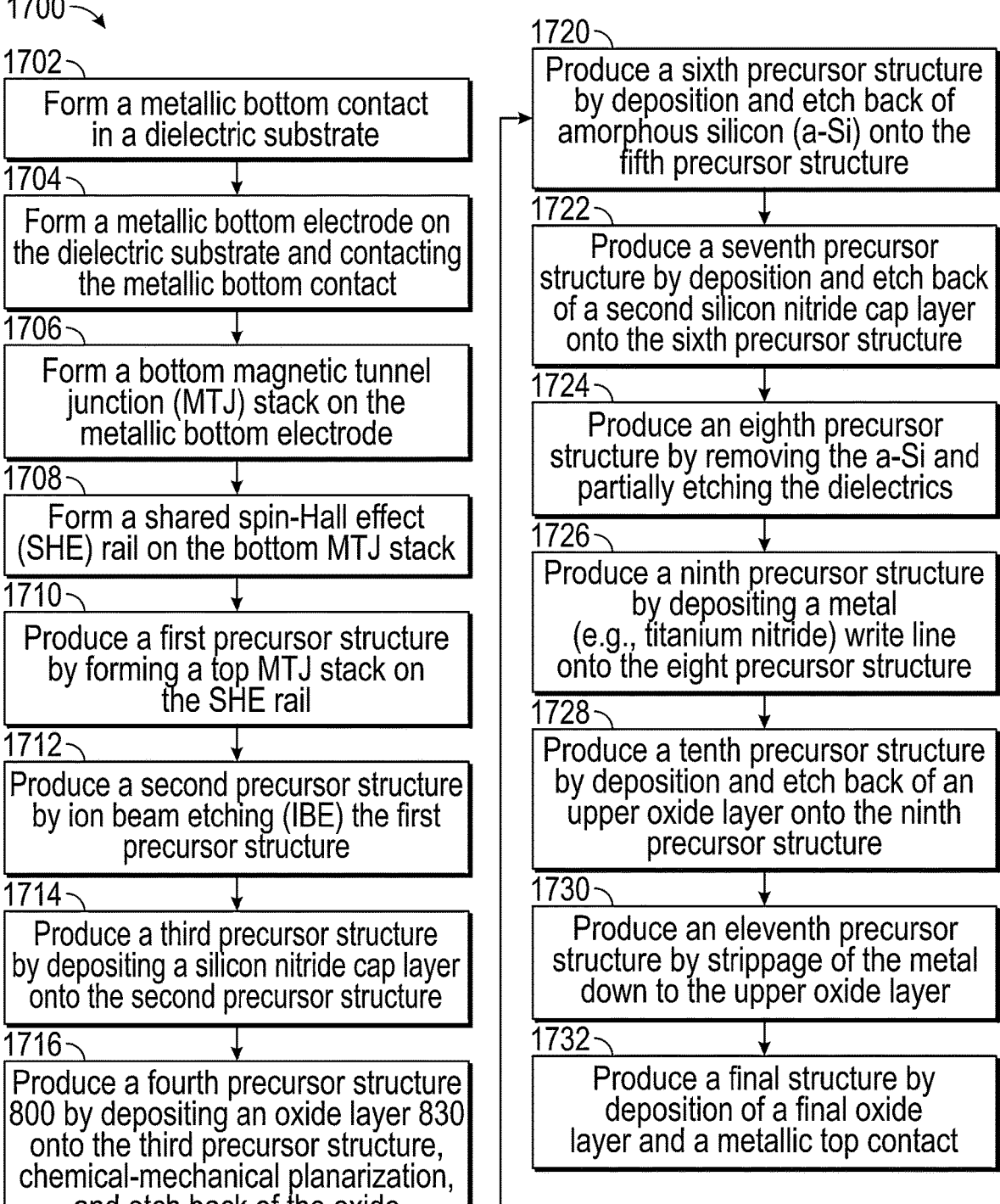

1700

1702 — Form a metallic bottom contact in a dielectric substrate

1704 — Form a metallic bottom electrode on the dielectric substrate and contacting the metallic bottom contact 1706 — Form a bottom magnetic tunnel junction (MTJ) stack on the metallic bottom electrode 1708 — Form a shared spin-Hall effect (SHE) rail on the bottom MTJ stack 1710 — Produce a first precursor structure by forming a top MTJ stack on the SHE rail 1712 — Produce a second precursor structure by ion beam etching (IBE) the first precursor structure 1714 — Produce a third precursor structure by depositing a silicon nitride cap layer onto the second precursor structure 1716 — Produce a fourth precursor structure 800 by depositing an oxide layer 830 onto the third precursor structure, chemical-mechanical planarization, and etch back of the oxide 1718 — Produce a fifth precursor structure by etching and stripping the silicon nitride cap down to the oxide layer 1720 — Produce a sixth precursor structure by deposition and etch back of amorphous silicon (a-Si) onto the fifth precursor structure 1722 — Produce a seventh precursor structure by deposition and etch back of a second silicon nitride cap layer onto the sixth precursor structure 1724 — Produce an eighth precursor structure by removing the a-Si and partially etching the dielectrics 1726 — Produce a ninth precursor structure by depositing a metal (e.g., titanium nitride) write line onto the eight precursor structure 1728 — Produce a tenth precursor structure by deposition and etch back of an upper oxide layer onto the ninth precursor structure 1730 — Produce an eleventh precursor structure by strippage of the metal down to the upper oxide layer 1732 — Produce a final structure by deposition of a final oxide layer and a metallic top contact

*FIG. 17*

STACKED SPIN-ORBIT TORQUE MAGNETORESISTIVE RANDOM ACCESS MEMORY

BACKGROUND

The present invention relates to the electrical, electronic, and computer arts, and more specifically, to magnetoresistive random access memory (MRAM).

MRAM is a technology for storing information. It is a type of non-volatile random-access memory that stores data in magnetic domains. Access times for MRAM can be improved using electron spin transfer techniques, such as spin orbit torque (SOT). MRAM utilizes tunnel magnetoresistance for data storage.

Magnetic tunnel junction stacks are suitable for use in various electronic applications, including non-volatile memory devices and magnetic field sensors. Magnetic random access memory (MRAM) can, for example, offer faster operational speed than flash memory. MRAM devices may be able to replace dynamic random access memory (DRAM) devices in some applications. MRAM is non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) device (i.e., memory cell) for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ storage element results in a change to the MTJ resistance, hence the name "Magnetoresistive" RAM.

Tunnel magnetoresistance (TMR) is a magnetoresistive effect that occurs in a magnetic tunnel junction (MTJ). Magnetic tunnel junctions include two magnetic layers and a tunnel barrier layer positioned between the magnetic layers. The magnetic layers can be characterized as "reference" and "free" layers, respectively while the tunnel barrier can be a thin tunneling oxide layer. The magnetization direction of one layer of the junction is fixed so that it serves as the reference layer. The magnetization of the free layer can be determined by an electrical input. A MTJ includes two stable resistance states. Charge current from the reference layer to the free layer causes the MTJ to switch between states by overcoming the energy barrier.

Magnetic tunnel junctions are manufactured in thin film technology. On an industrial scale the film deposition is done by magnetron sputter deposition; on a laboratory scale molecular beam epitaxy, pulsed laser deposition and electron beam physical vapor deposition are also utilized. The junctions are prepared by photolithography.

MTJ fabrication to form an MRAM bit can be challenging. One challenge relates to formation of MTJ pillars using etching techniques that can leave metallic residues on the pillars. Such residues may cause electrical shorts across the tunnel barriers or otherwise compromise device performance. Ion beam etching (IBE) allows the etching of stacks of multiple materials where the vapor pressure of the materials to be removed is negligible, but can leave metallic residues that adversely affect performance. Oxidation of the metallic residue in air following IBE is difficult to control due, in part, to the non-uniform sizes of the residue on the MTJ pillars. For IBE processing of MTJ pillars, the amount and size of residues is a function of the etch pattern density and the etch depth. Overall magnetic response, device performance and process repeatability may be adversely impacted using conventional oxidation of the metallic residue.

SUMMARY

Principles of the invention provide techniques for stacked spin-orbit torque magnetoresistive random access memory (SOT-MRAM). In one aspect, an exemplary semiconductor structure, according to an aspect of the invention, includes a bottom magnetic tunnel junction (MTJ) stack that includes a bottom fixed layer, a bottom barrier layer on top of and contacting the bottom fixed layer, and a bottom free layer on top of and contacting the bottom barrier layer. The exemplary semiconductor structure also includes a top MTJ stack that includes a top fixed layer, a top barrier layer below and contacting the top fixed layer, and a top free layer below and contacting the top barrier layer. Additionally, the exemplary semiconductor structure also includes a spin-Hall effect (SHE) rail that includes a dielectric, a top heavy metal layer that is above and contacting the dielectric and is below and contacting the top free layer of the top MTJ stack, and a bottom heavy metal layer that is below and contacting the dielectric and is on top of and contacting the bottom free layer of the bottom MTJ stack.

In another aspect, an exemplary semiconductor structure includes a bottom magnetic tunnel junction (MTJ) stack that includes a bottom fixed layer, a bottom barrier layer on top of and contacting the bottom fixed layer, and a bottom free layer on top of and contacting the bottom barrier layer; a top MTJ stack that includes a top fixed layer, a top barrier layer below and contacting the top fixed layer, and a top free layer below and contacting the top barrier layer; and a spin-Hall effect (SHE) rail that includes a dielectric, a top heavy metal layer that is above and contacting the dielectric and is below and contacting the top free layer of the top MTJ stack, a bottom heavy metal layer that is below and contacting the dielectric and is on top of and contacting the bottom free layer of the bottom MTJ stack, and a metal write line that is sandwiched between and contacting the top and bottom heavy metal layers.

According to another aspect, an exemplary method for making a semiconductor structure includes: forming a metallic bottom contact in a dielectric substrate; forming a metallic bottom electrode on the dielectric substrate and contacting the metallic bottom contact; forming a bottom magnetic tunnel junction (MTJ) stack on the metallic bottom electrode, wherein the bottom MTJ stack comprises a bottom fixed layer, a bottom tunnel barrier layer, and a bottom free layer; forming a shared spin-Hall effect (SHE) rail on the bottom MTJ stack, wherein the SHE rail comprises a bottom heavy metal layer, a dielectric layer, and a top heavy metal layer; and producing a first precursor structure by forming a top MTJ stack on the SHE rail, wherein the top MTJ stack comprises a top free layer, a top tunnel barrier layer, and a top fixed layer.

In view of the foregoing, techniques of the present invention can provide substantial beneficial technical effects. For example, one or more embodiments provide one or more of:

MTJ (magnetic tunnel junction) stack deposition and patterning together for both top and bottom SOT-MRAM cells, which saves cost of manufacture, improves accuracy of alignment, and/or mitigates back sputter problems.

Dielectric sandwiched by thin heavy metal layers for good dielectric isolation and enough spin Hall-spin-Hall current.

Same size for top and bottom SOT-MRAM to save footprint of MRAM cells, which also helps to mitigate back sputter problems.

Two stacked SOT-MRAM sharing the same spin-Hall effect (SHE) power rail in the middle, leading to more efficient use of space on chip and/or lower power consumption.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 17 depicts steps of a method for fabricating the structure of FIG. 4.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Silicon-based devices typically include multiple interconnect metallization layers above a device (front-end-of-line/FEOL) layer that contains field-effect transistors (FETs) or other structures. Middle-of-line (MOL) processing includes steps typically used for fabricating metal contacts for logic circuitry components such as field-effect transistors (FETs), resistors, diodes, and capacitors. Back-end-of-line (BEOL) processing involves the creation of metal interconnecting wires that connect the devices formed in FEOL processing to form electrical circuits. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. M2 and M3 lines may have wider pitches than the M1 line. The interconnecting wires within each metal line are electrically connected to interconnecting wires in other metal lines and to the devices in the FEOL layer.

Access times and overall circuit performance can be potentially obtained by integrating memory devices close to the FEOL layer rather than in special sections on a chip. An MRAM is one type of memory device that can be integrated with BEOL CMOS processing just above the FEOL layer, for example between the M2 and M3 lines or layers.

Figures 1, 2:
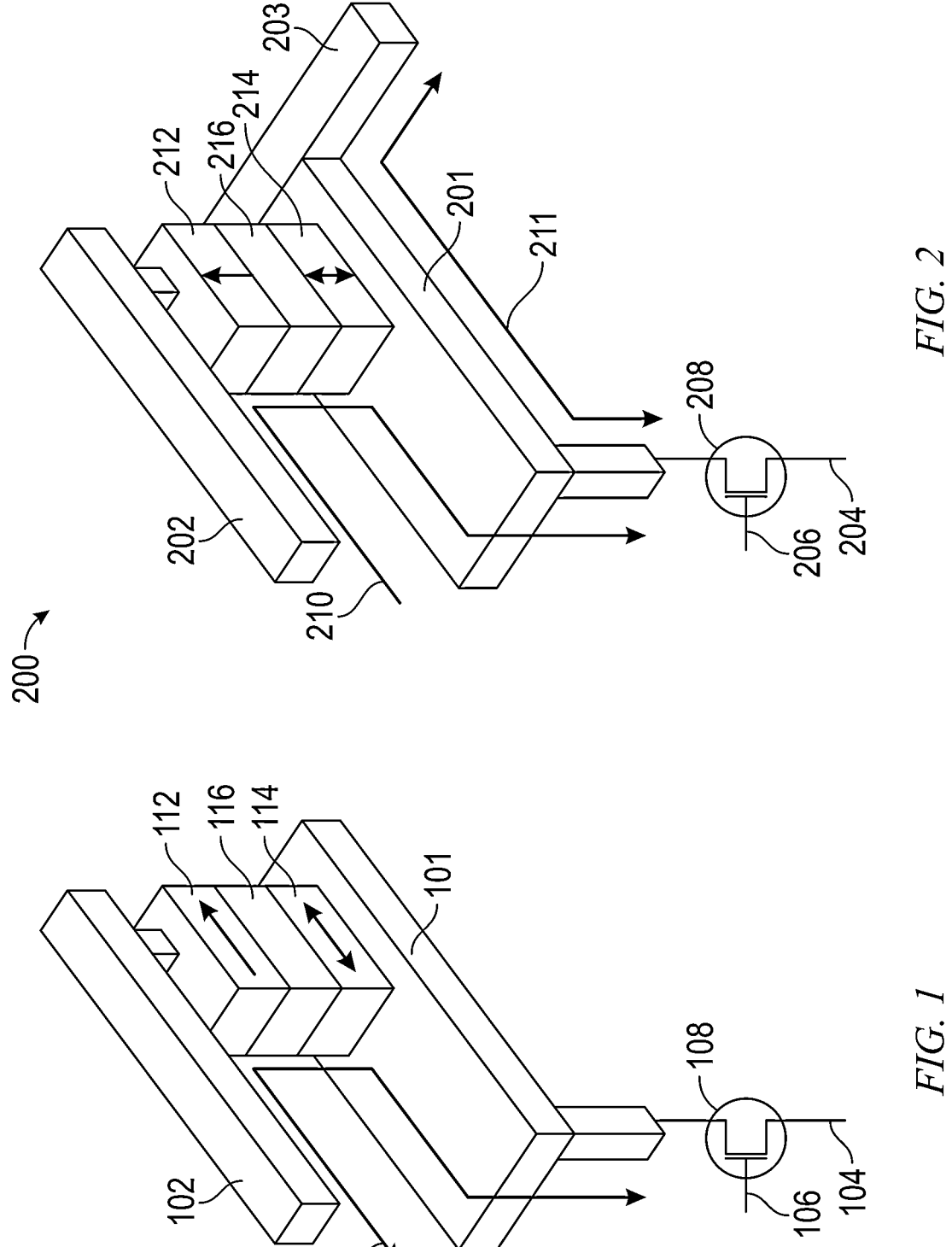
FIG. 1 depicts a spin-torque-transfer magnetoresistive (STT-MRAM) memory structure that includes a magnetic tunnel junction (MTJ) stack.
FIG. 2 depicts a spin-orbit-torque magnetoresistive (SOT-MRAM) memory structure that includes an MTJ stack.

FIG. 1 depicts a spin-torque-transfer magnetoresistive (STT-MRAM) memory structure 100 that includes a magnetic tunnel junction (MTJ) stack 112, 114, 116 mounted on a bottom electrode 101. A bit line 102 and a source line 104 supply read/write voltages to the stack, which includes a fixed layer 112, a free layer 114, and a dielectric 116. A word line 106 controls the application of read/write voltages via an access transistor 108. The singular read/write path 110 flows from the bit line 102 through the stack 112, 114, 116, the bottom electrode 101, and the access transistor 108 to the source line 104.

FIG. 2 depicts a spin-orbit-torque magnetoresistive (SOT-MRAM) memory structure 200 that includes an MTJ stack 212, 214, 216 mounted on a bottom electrode 201. A read line 202, a write line 203, and a source line 204 supply read and write voltages to the stack, which comprises a fixed layer 212, a free layer 214, and a dielectric 216. A word line 206 controls application of the read and write voltages through an access transistor 208. The read path 210 flows from read line 202 through the stack 212, 214, 216, the bottom electrode 201, and the access transistor 208 to the source line 204. The write path 211 flows from write line 203 through the stack 212, 214, 216, the bottom electrode 201, and the access transistor 208 to the source line 204.

Figures 3, 4:
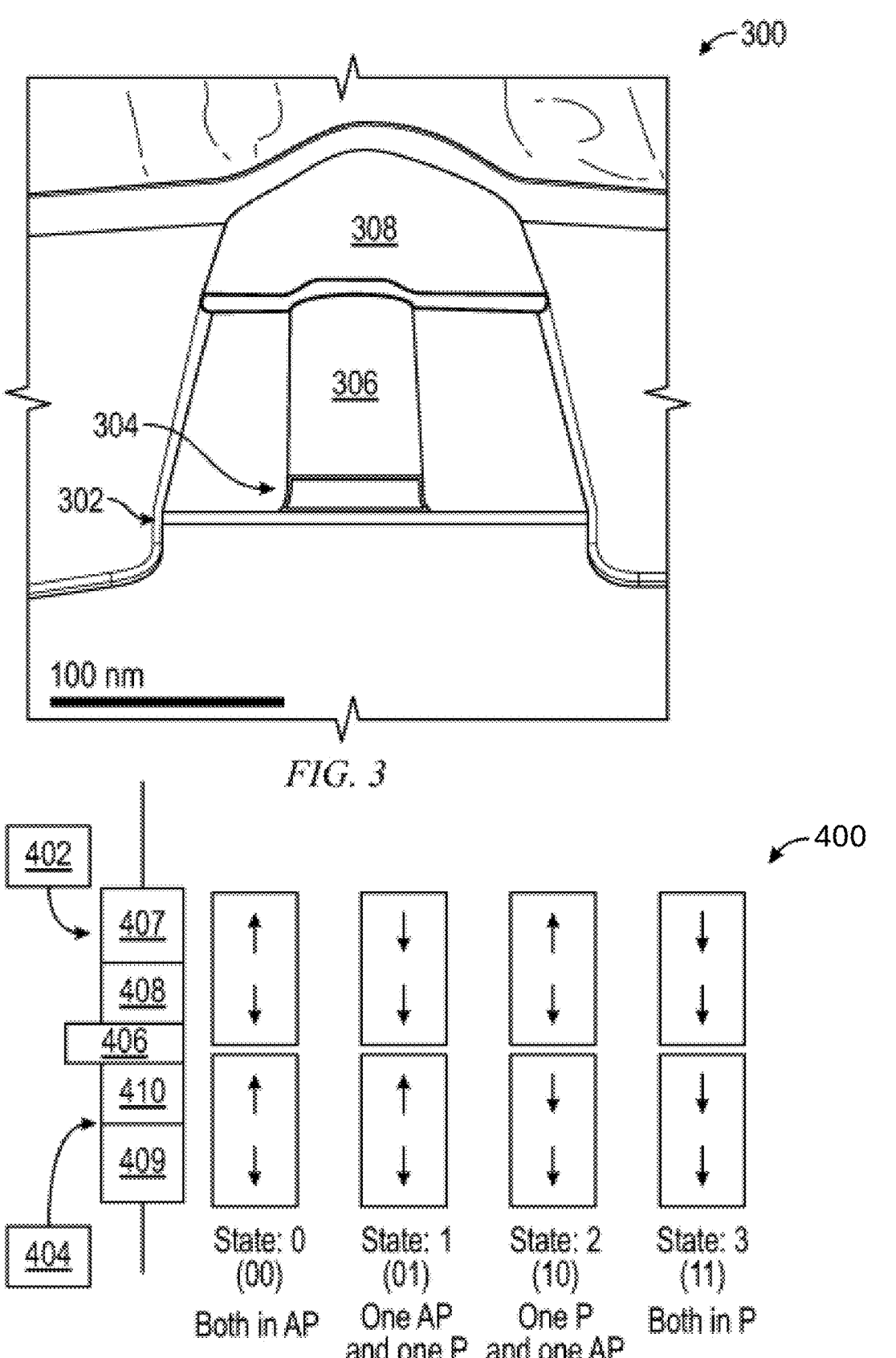
FIG. 3 depicts a prototype SOT-MRAM in which a bottom plate and a top plate are wider than a middle MTJ stack.
FIG. 4 depicts magnetic domains of a twinned SOT-MRAM structure with shared spin-Hall effect (SHE) rail that permits two-bit data storage, according to an exemplary embodiment.

FIG. 3 depicts an approach to fabricating an SOT-MRAM structure 300, which has a bottom electrode 302, a MTJ stack 304, 306, and a top electrode 308. The narrower MTJ stack 304, 306 can be formed, for example, by ion beam etching (IBE), which is a non-selective process. Reactive ion etch (RIE) technology is not used in one or more embodiments because the MTJ stack 304, 306 includes numerous very thin layers (1 angstrom or thinner) of different materials, such that the selective process of RIE would not be easily controllable. However, IBE presents a problem of back sputter from the wide bottom electrode 302 onto sides of the MTJ stack 304, 306. The back sputtered material can short the stack 304, 306, adversely impacting operation of the structure 300.

FIG. 4 depicts potential memory states of a twinned SOT-MRAM structure 400, according to an exemplary embodiment. The twinned SOT-MRAM structure 400 includes an upper MTJ stack 402 and a lower MTJ stack 404 that are connected at the middle by a shared spin-Hall-effect (SHE) rail 406. Respective fixed layers 407, 409 of the upper and lower stacks 402, 404 have constant magnetic polarities; respective free layers 408, 410 of the upper and lower stacks 402, 404 can assume the same or different magnetic polarities, represented by UP (0) and DOWN (1) arrows, so that the entire structure 400 can retain two bits of data in a non-volatile manner.

FIG. 5 through FIG. 16 depict various semiconductor structures produced at certain steps of a fabrication method 1700 (shown in FIG. 17) for the structure 400.

Figure 5:
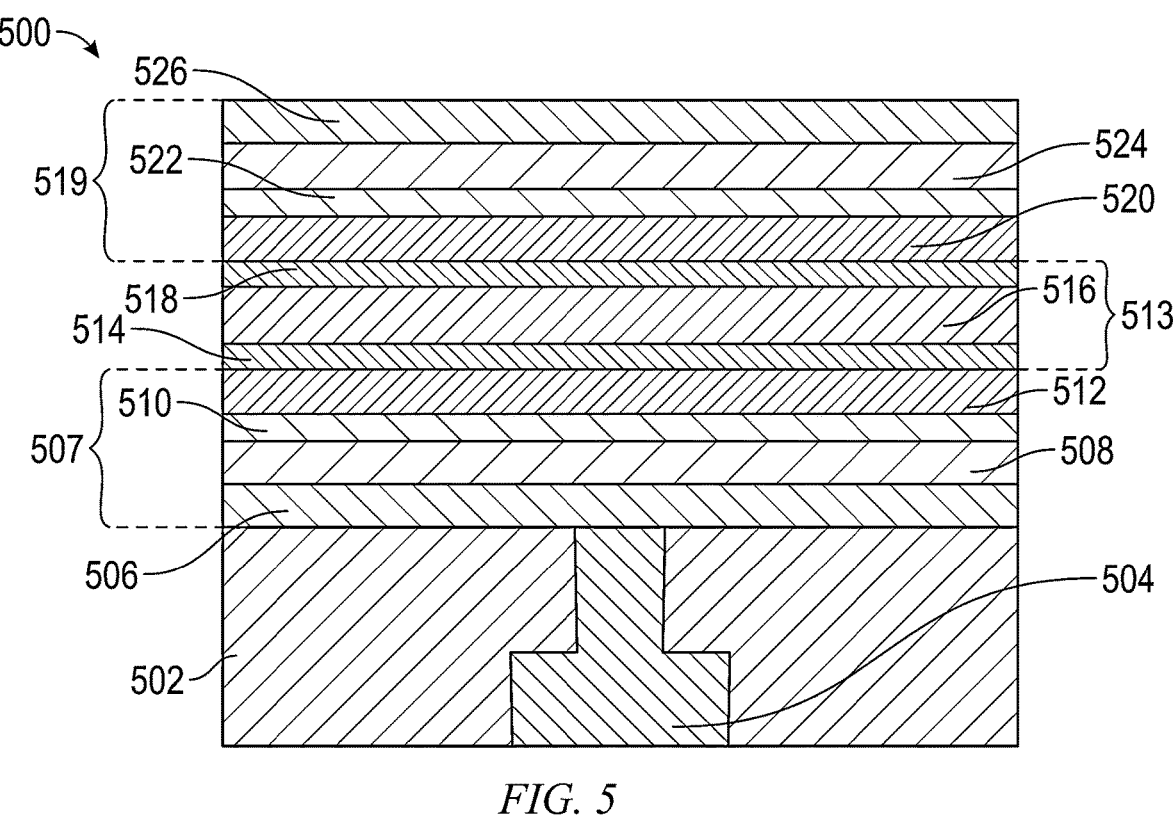
FIG. 5 depicts an intermediate semiconductor structure in fabrication of the structure of FIG. 4, according to an exemplary embodiment.

FIG. 5 depicts a first precursor structure 500. The method 1700 includes, at 1702, forming a metallic bottom contact 504 in a dielectric substrate 502. At 1704, form a metallic bottom electrode 506 on the dielectric substrate and contacting the metallic bottom contact. At 1706, form a bottom magnetic tunnel junction (MTJ) stack 507 on the metallic bottom electrode. The bottom MTJ stack includes a bottom fixed layer 508, a bottom tunnel barrier layer 510, and a bottom free layer 512. At 1708, form a shared spin-Hall effect (SHE) rail 513 on the bottom MTJ stack. The SHE rail comprises a bottom heavy metal layer 514, a dielectric layer 516, and a top heavy metal layer 518. At 1710 produce the first precursor structure 500 by forming a top MTJ stack 519 on the SHE rail, wherein the top MTJ stack comprises a top free layer 520, a top tunnel barrier layer 522, and a top fixed layer 524. Thus, the structure 500 includes a dielectric substrate 502, a metallic bottom contact 504, and a metallic bottom electrode 506. Above the bottom electrode 506 is a bottom MTJ stack 507, which includes a ferromagnetic bottom reference (fixed) layer 508, a bottom tunnel barrier 510 (e.g., aluminum oxide or magnesium oxide dielectric), and a ferromagnetic bottom free layer 512. Above the bottom MTJ stack 507 is a shared SHE rail 513, which includes a bottom heavy metal layer 514, dielectrics 516, and a top heavy metal 518. In one or more embodiments, exemplary heavy metals include: platinum (Pt), palladium (Pd), tungsten (W), tantalum (Ta). Above the shared SHE rail 513 is a top MTJ stack 519, which includes a top free layer 520, a top tunnel barrier 522, and a top reference (fixed) layer 524. Above the top MTJ stack 519 is a top electrode 526.

For high performance MRAM based on perpendicular MTJ structures, well defined interfaces and interface control are pertinent. In one or more embodiments, MTJ structures include a cobalt (Co)-based synthetic anti-ferromagnet (SAF), a cobalt-iron-boron (CoFeB)-based reference layer, a magnesium oxide (MgO)-based tunnel barrier, a CoFeB-based free layer, and capping layers containing, for example, tantalum (Ta) and/or ruthenium (Ru). Embedded MTJ structures often are formed by patterning of blanket MTJ stacks. Reactive ion etch (RIE) processing and ion beam etch (IBE) processing of such MTJ stacks presents a major challenge, as such processing typically leads to shorts due to re-sputtering of thick bottom metal layers onto the MTJ stack sidewalls. Advantageously, one or more embodiments provide embedded MTJ structures formed by a method with a reduced risk of shorts due to metal re-sputtering.

Figure 6:
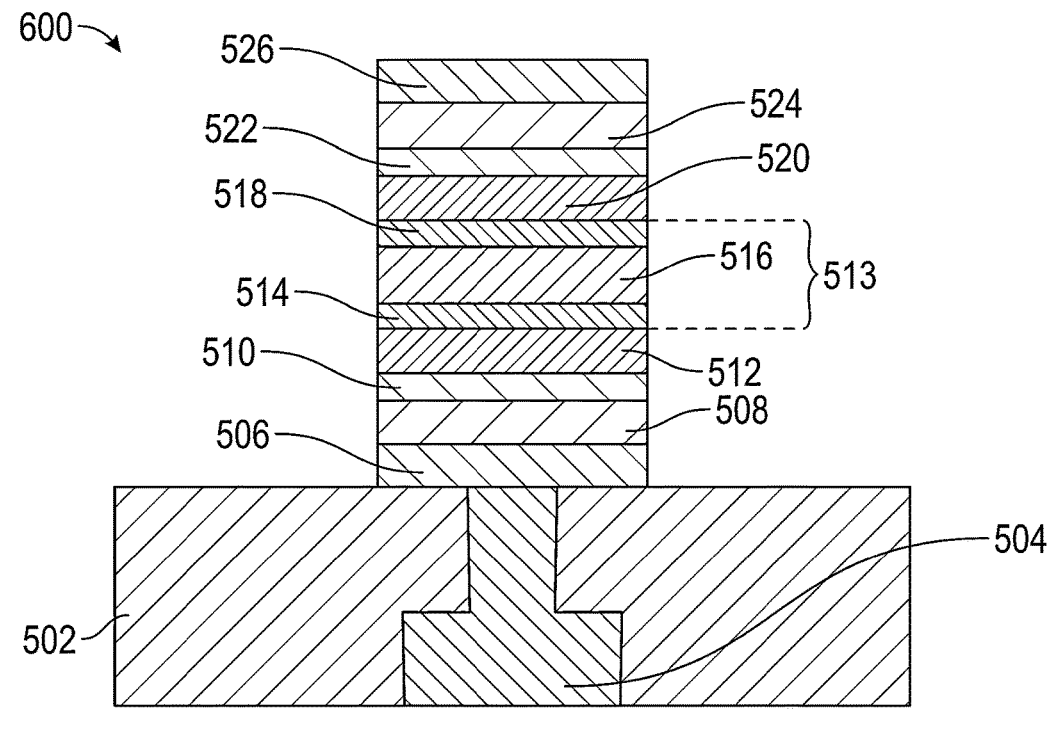
FIGS. 6-15 depict intermediate steps in fabrication of the structure of FIG. 4, according to an exemplary embodiment.

FIG. 6 depicts a second precursor structure 600, following step 1712 of ion beam etching (IBE) the structure 500. Note that the substrate 502, being a dielectric, does not present any risk of shorting onto sides of the stacks 507, 519 (best seen in FIG. 5) due to back sputter during IBE.

Figure 7:
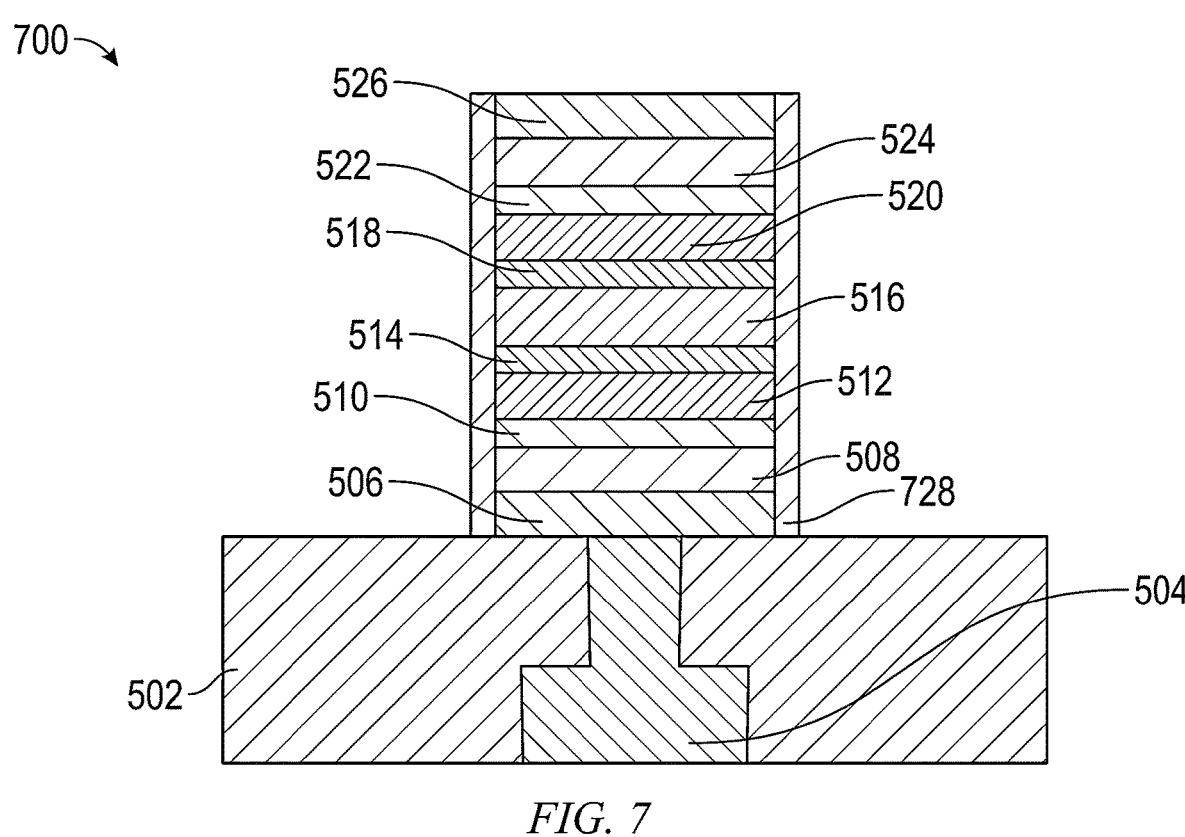

FIG. 7 depicts a third precursor structure 700, following step 1714 of depositing a silicon nitride cap layer 728 onto the structure 600.

Figure 8:
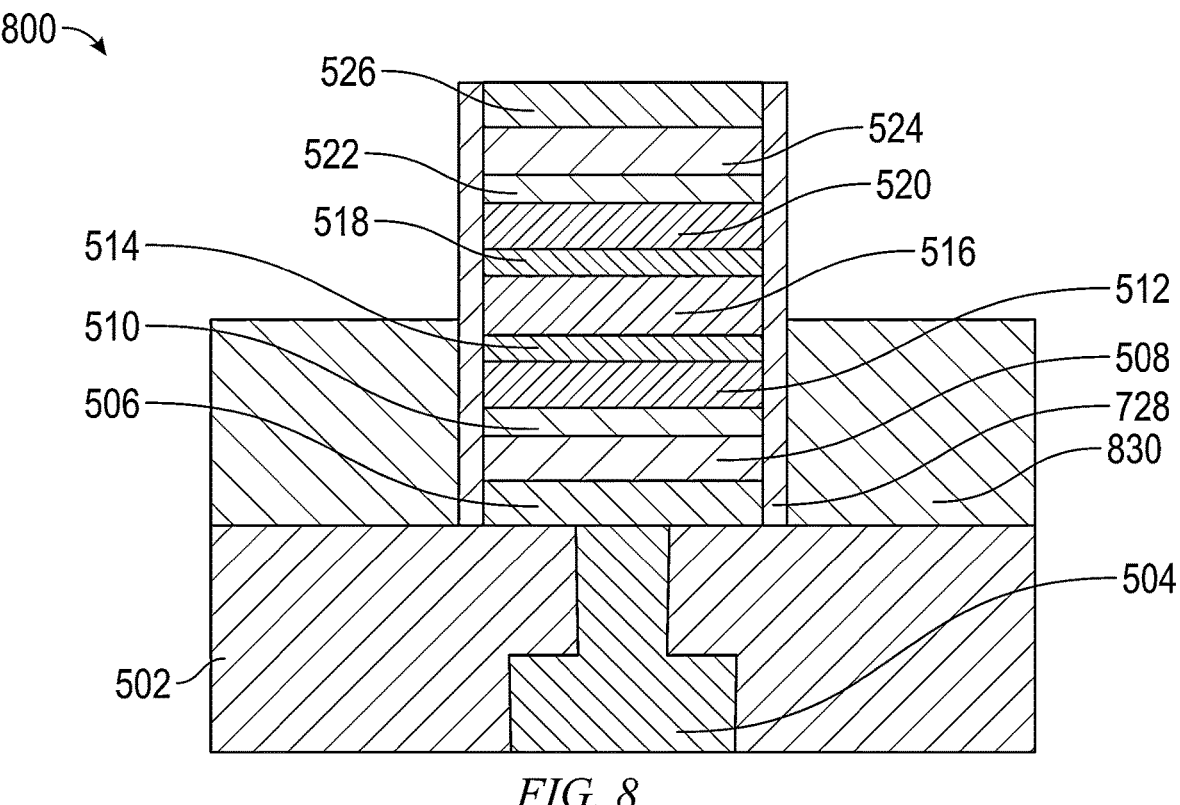

FIG. 8 depicts a fourth precursor structure 800, following step 1716 of depositing an oxide layer 830 onto the structure 700, chemical-mechanical planarization, and etch back of the oxide 830.

Figure 9:
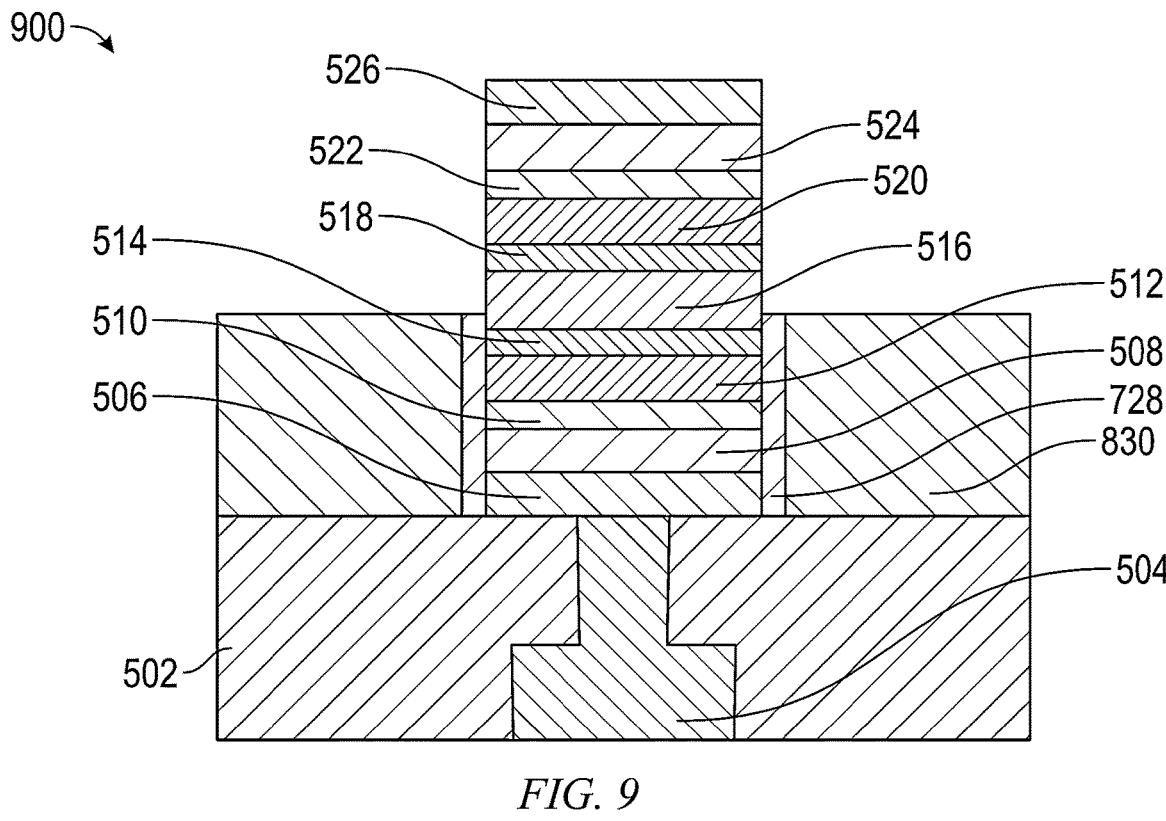

FIG. 9 depicts a fifth precursor structure 900, following step 1718 of etching and stripping the silicon nitride cap 728 down to the oxide layer 830.

Figure 10:
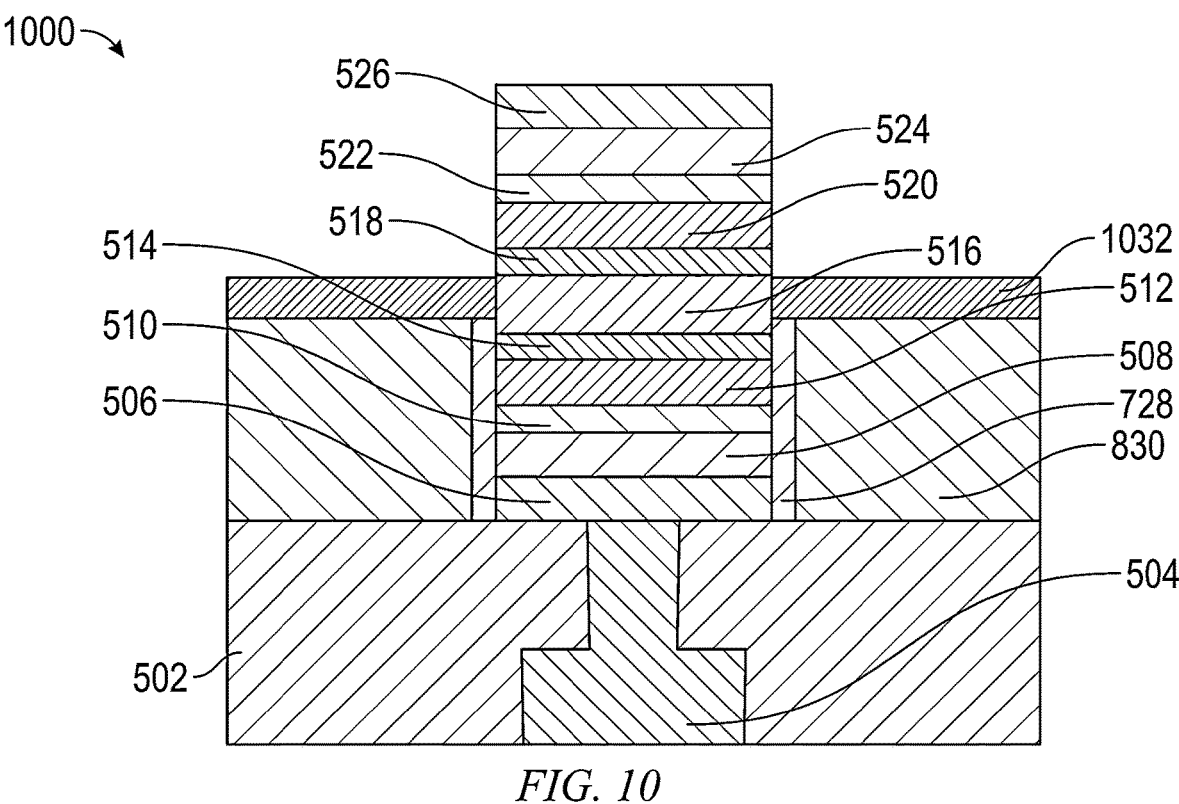

FIG. 10 depicts a sixth precursor structure 1000, following step 1720 of deposition and etch back of amorphous silicon (a-Si) 1032 onto the structure 900.

Figure 11:
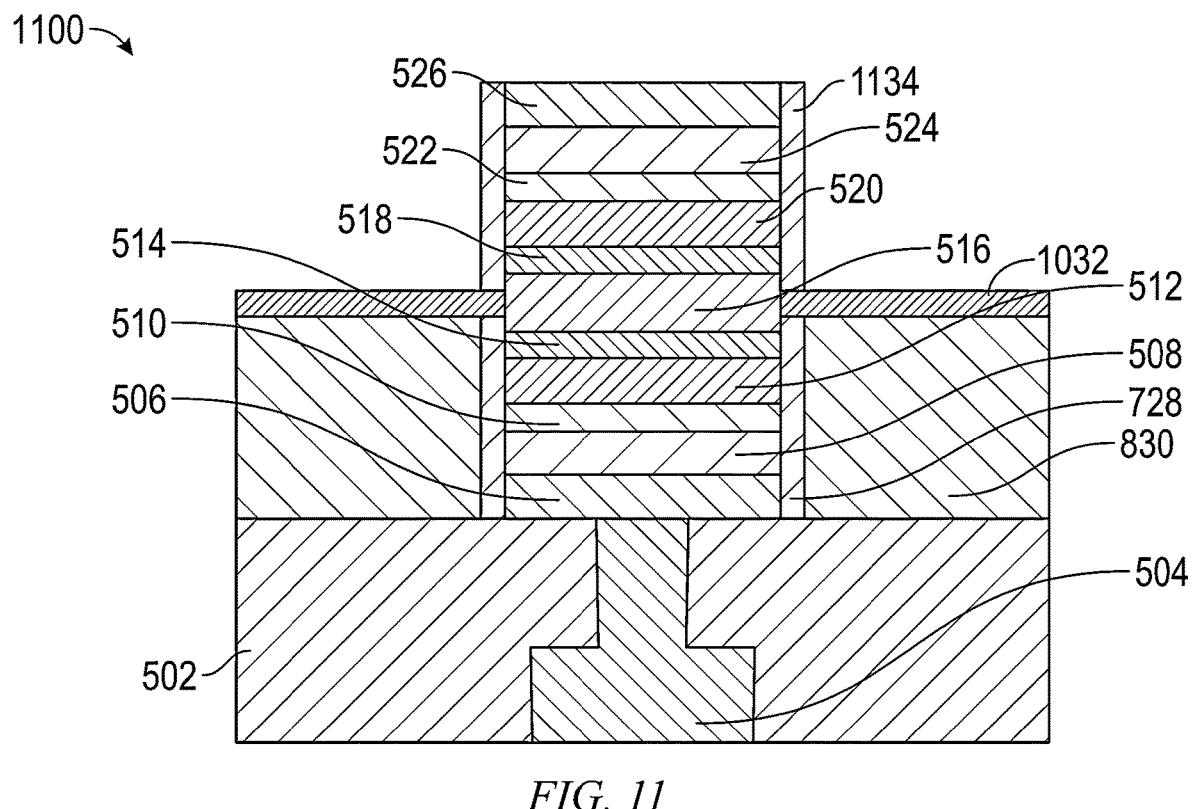

FIG. 11 depicts a seventh precursor structure 1100, following step 1722 of deposition and etch back of a second silicon nitride cap layer 1134 onto the structure 1000.

Figure 12:
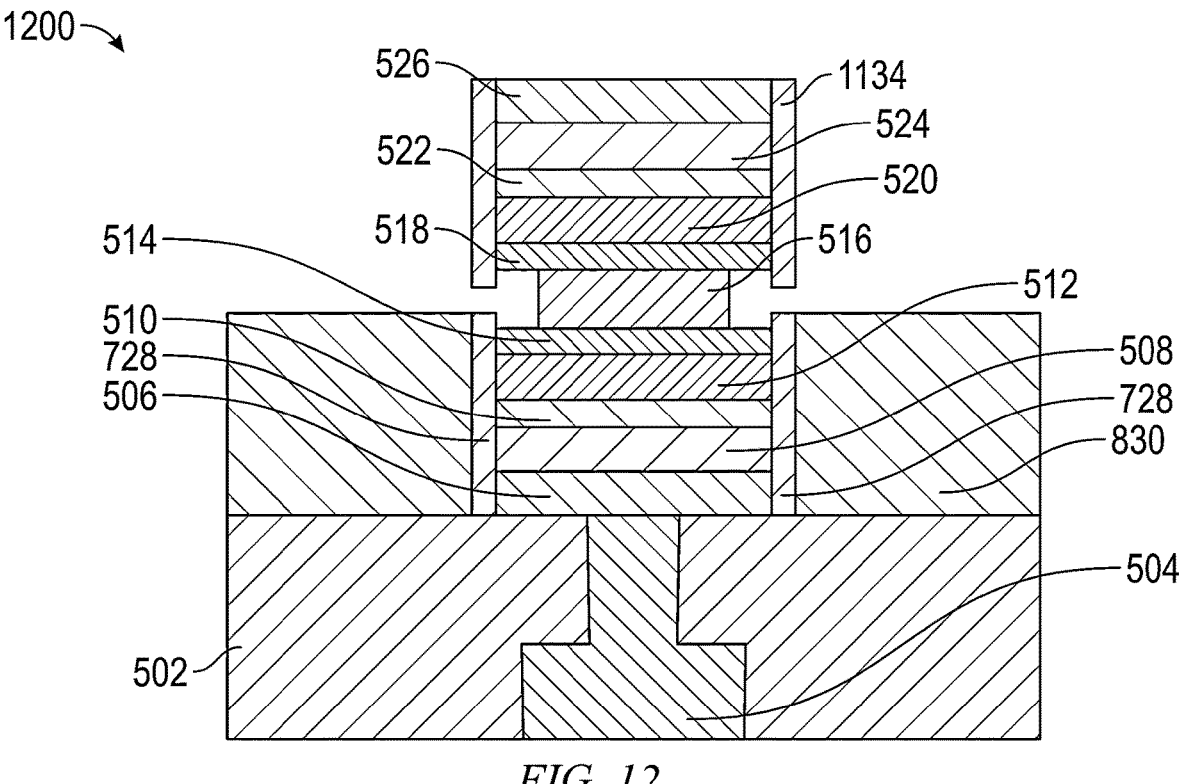

FIG. 12 depicts an eighth precursor structure 1200, following step 1724 of removing the a-Si 1032 and partially etching the dielectrics 516.

Figure 13:
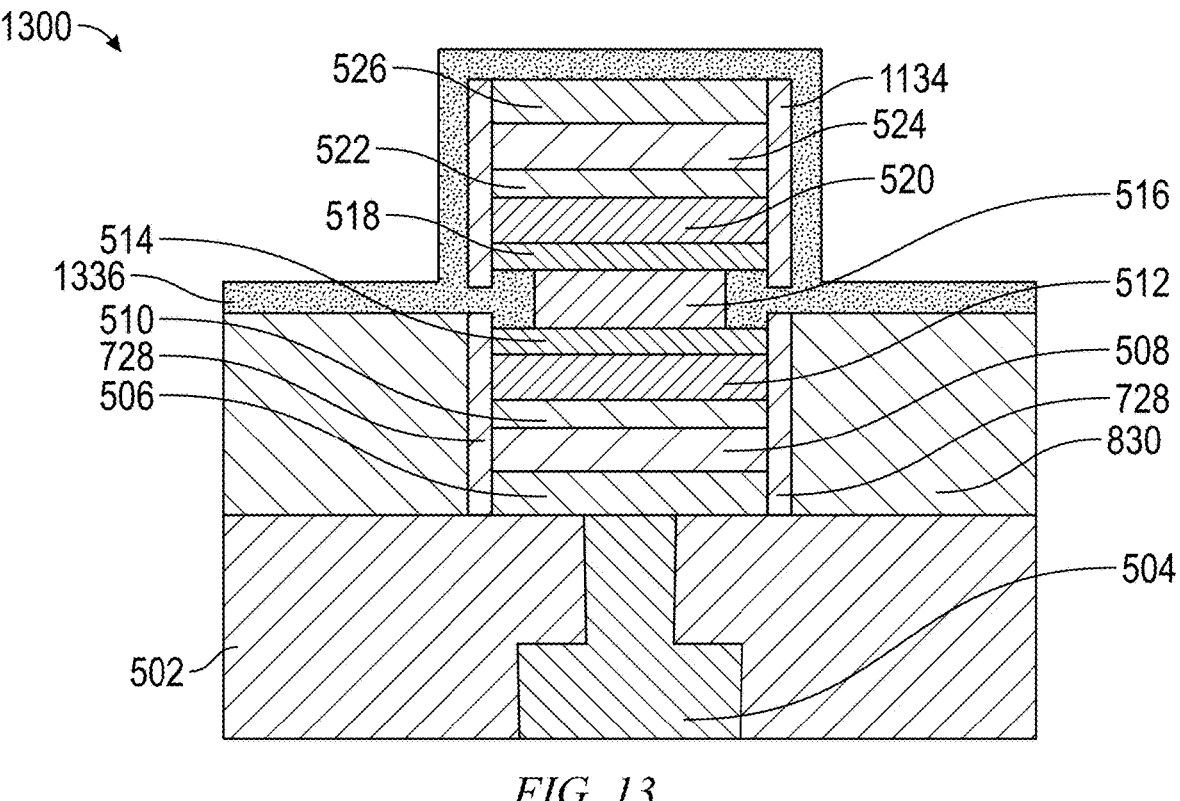

FIG. 13 depicts a ninth precursor structure 1300, following step 1726 of chemical vapor deposition or atomic layer deposition of a metal (e.g., titanium nitride) write line 1336 onto the structure 1200. Because (as best seen in FIG. 5) the SHE rail 513 is shared between top and bottom stacks 507, 519, the write line 1336 can supply write voltage to either the top free layer 520 or the bottom free layer 512, or to both.

Figure 14:
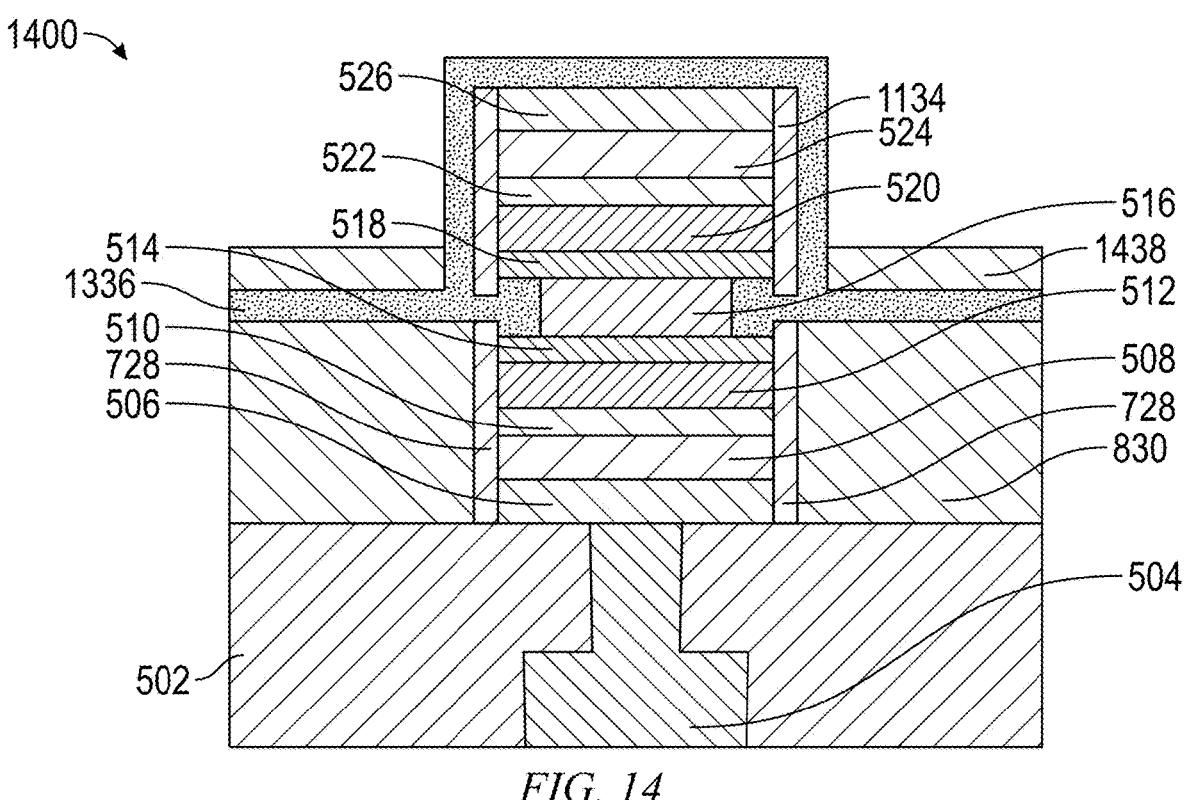

FIG. 14 depicts a tenth precursor structure 1400, following step 1728 of deposition and etch back of an upper oxide layer 1438 onto the structure 1300.

Figure 15:
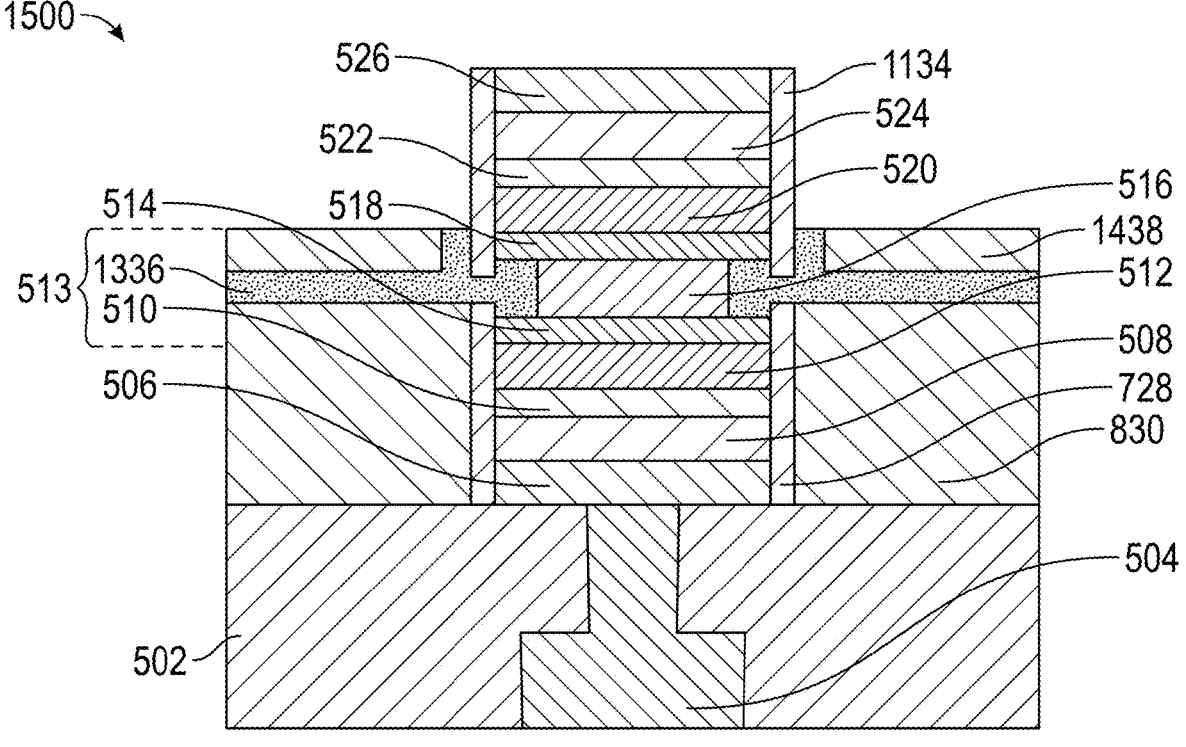

FIG. 15 depicts an eleventh precursor structure 1500, following step 1730 of strippage of the metal 1336 down to the upper oxide layer 1438.

Figure 16:
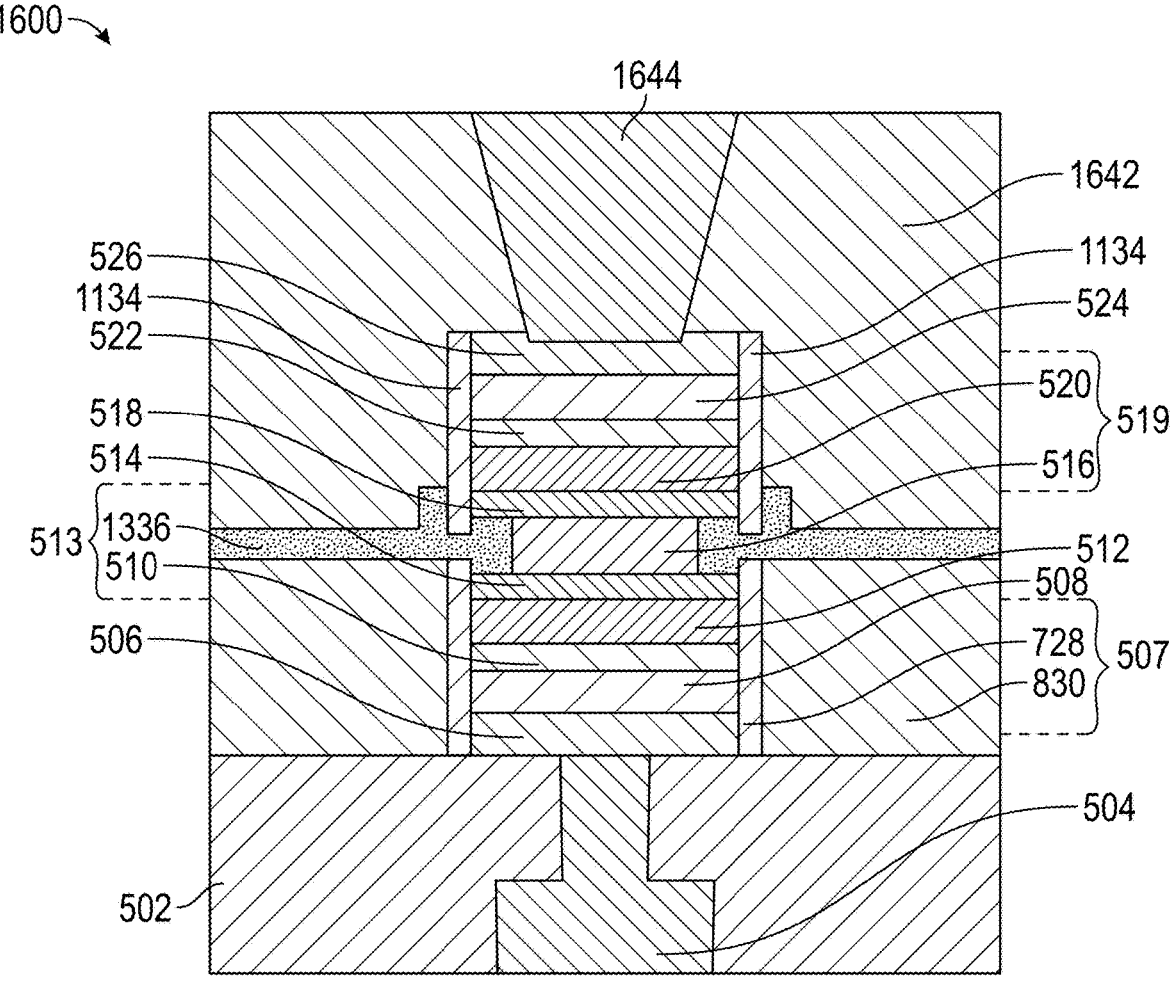
FIG. 16 depicts a finished stage of the structure of FIG. 4, according to an exemplary embodiment.

FIG. 16 depicts a final structure 1600, following step 1732 of deposition of a final oxide layer 1642 and a metallic top contact 1644. The final structure 1600 is a detailed view of an embodiment of the structure 400.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, di chlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

As noted, although the overall fabrication method and the structures formed thereby are novel, certain individual processing steps required to implement the method may utilize conventional semiconductor fabrication techniques and conventional semiconductor fabrication tooling. As also noted, these techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary semiconductor structure 500, according to an aspect of the invention, includes a bottom magnetic tunnel junction (MTJ) stack 507 that includes a bottom fixed layer 508, a bottom barrier layer 510 on top of and contacting the bottom fixed layer, and a bottom free layer 512 on top of and contacting the bottom barrier layer. The exemplary semiconductor structure 500 also includes a top MTJ stack 519 that includes a top fixed layer 524, a top barrier layer 522 below and contacting the top fixed layer, and a top free layer 520 below and contacting the top barrier layer. Additionally, the exemplary semiconductor structure 500 also includes a spin-Hall effect (SHE) rail 513 that includes a dielectric 516, a top heavy metal layer 518 that is above and contacting the dielectric and is below and contacting the top free layer of the top MTJ stack, and a bottom heavy metal layer 514 that is below and contacting the dielectric and is on top of and contacting the bottom free layer of the bottom MTJ stack. Thus, advantageously, the SHE rail is shared between the top and bottom MTJ stacks so that, in one or more embodiments, the stacks can operate together.

In one or more embodiments, a semiconductor structure also includes a bottom electrode 506 underlying and contacting the bottom fixed layer of the bottom MTJ stack.

In one or more embodiments, a semiconductor structure also includes a top electrode 526 on top of and contacting the top fixed layer of the top MTJ stack.

In one or more embodiments, a semiconductor structure also includes a top contact 1644 on top of and contacting the top electrode; and a bottom contact 504 below and contacting the bottom electrode.

In one or more embodiments, a semiconductor structure also includes a bottom silicon nitride cap layer 728 sheathing the bottom MTJ stack.

In one or more embodiments, a semiconductor structure also includes a top silicon nitride cap layer 1134 sheathing the top MTJ stack.

In one or more embodiments, a semiconductor structure also includes oxide layers 830, 1642 encasing the top and bottom MTJ stacks.

According to another aspect of the invention, an exemplary semiconductor structure 1300 includes a bottom magnetic tunnel junction (MTJ) stack 507 that includes a bottom fixed layer, a bottom barrier layer on top of and contacting the bottom fixed layer, and a bottom free layer on top of and contacting the bottom barrier layer; a top MTJ stack 519 that includes a top fixed layer, a top barrier layer below and contacting the top fixed layer, and a top free layer below and contacting the top barrier layer; and a spin-Hall effect (SHE) rail 513 that includes a dielectric, a top heavy metal layer that is above and contacting the dielectric and is below and contacting the top free layer of the top MTJ stack, a bottom heavy metal layer that is below and contacting the dielectric and is on top of and contacting the bottom free layer of the bottom MTJ stack, and a metal write line 1336 that is sandwiched between and contacting the top and bottom heavy metal layers.

In one or more embodiments, the metal write line extends over and encases the top MTJ stack.

In one or more embodiments, an oxide layer covers a lower portion of the metal write line and exposes an upper portion of the metal write line.

In one or more embodiments, a semiconductor structure also includes a bottom silicon nitride cap layer sheathing the bottom MTJ stack.

In one or more embodiments, a semiconductor structure also includes a top silicon nitride cap layer sheathing the top MTJ stack.

In one or more embodiments, a semiconductor structure also includes oxide layers encasing the top and bottom MTJ stacks and the metal write line.

According to another aspect, an exemplary method 1700 for making a semiconductor structure includes: at 1702, forming a metallic bottom contact 504 in a dielectric substrate 502; at 1704, forming a metallic bottom electrode 506 on the dielectric substrate and contacting the metallic bottom contact; at 1706, forming a bottom magnetic tunnel junction (MTJ) stack 507 on the metallic bottom electrode, wherein the bottom MTJ stack comprises a bottom fixed layer 508, a bottom tunnel barrier layer 510, and a bottom free layer 512; at 1708, forming a shared spin-Hall effect (SHE) rail 513 on the bottom MTJ stack, wherein the SHE rail comprises a bottom heavy metal layer 514, a dielectric layer 516, and a top heavy metal layer 518; and at 1710 producing a first precursor structure 500 by forming a top MTJ stack 519 on the SHE rail, wherein the top MTJ stack comprises a top free layer 520, a top tunnel barrier layer 522, and a top fixed layer 524.

In one or more embodiments, the exemplary method also includes, at 1712, producing a second precursor structure 600 by ion beam etching, down to the dielectric substrate, sides of the first precursor structure.

In one or more embodiments, the exemplary method also includes, at 1714, producing a third precursor structure 700 by depositing a silicon nitride cap layer onto the second precursor structure.

In one or more embodiments, the exemplary method also includes, at 1716, producing a fourth precursor structure 800 by depositing an oxide layer onto the third precursor structure; chemical-mechanical planarization; and etch back of the oxide layer.

In one or more embodiments, the exemplary method also includes, at 1718, producing a fifth precursor structure 900 by etch and strip of the silicon nitride cap down to the oxide layer.

In one or more embodiments, the exemplary method also includes, at 1720, producing a sixth precursor structure 1000 by deposition and etch back of amorphous silicon (a-Si) onto the fourth precursor structure.

In one or more embodiments, the exemplary method also includes, at 1722, producing a seventh precursor structure 1100 by deposition and etch back of a second silicon nitride cap layer onto the sixth precursor structure.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including magnetic tunnel junctions formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
a bottom magnetic tunnel junction (MTJ) stack that includes a bottom fixed layer, a bottom barrier layer on top of and contacting the bottom fixed layer, and a bottom free layer on top of and contacting the bottom barrier layer;
a top MTJ stack that includes a top fixed layer, a top barrier layer below and contacting the top fixed layer, and a top free layer below and contacting the top barrier layer; and
a spin-Hall effect (SHE) rail that includes:
a dielectric;
a top heavy metal layer that is above and contacting the dielectric and is below and contacting the top free layer of the top MTJ stack, the top heavy metal layer having a same width as the top free layer of the top MTJ stack; and
a bottom heavy metal layer that is below and contacting the dielectric and is on top of and contacting the bottom free layer of the bottom MTJ stack, the bottom heavy metal layer having a same width as the bottom free layer of the bottom MTJ stack,
wherein a width of the dielectric is less than the width of the top heavy metal layer and the width of the bottom heavy metal layer, such that distal ends of the top heavy metal layer and the bottom heavy metal layer extend beyond distal ends of the dielectric.

2. The semiconductor structure of claim 1, further comprising:
a bottom electrode underlying and contacting the bottom fixed layer of the bottom MTJ stack.

3. The semiconductor structure of claim 2, further comprising:
a top electrode on top of and contacting the top fixed layer of the top MTJ stack.

4. The semiconductor structure of claim 3, further comprising:
a top contact on top of and contacting the top electrode; and
a bottom contact below and contacting the bottom electrode.

5. The semiconductor structure of claim 1, further comprising:
a bottom silicon nitride cap layer sheathing the bottom MTJ stack.

6. The semiconductor structure of claim 5, further comprising:
a top silicon nitride cap layer sheathing the top MTJ stack.

7. The semiconductor structure of claim 6, further comprising:
oxide layers encasing the top and bottom MTJ stacks.

8. A semiconductor structure comprising:
a bottom magnetic tunnel junction (MTJ) stack that includes a bottom fixed layer, a bottom barrier layer on top of and contacting the bottom fixed layer, and a bottom free layer on top of and contacting the bottom barrier layer;
a top MTJ stack that includes a top fixed layer, a top barrier layer below and contacting the top fixed layer, and a top free layer below and contacting the top barrier layer; and
a spin-Hall effect (SHE) rail that includes a dielectric, a top heavy metal layer that is above and contacting the dielectric and is below and contacting the top free layer of the top MTJ stack, a bottom heavy metal layer that is below and contacting the dielectric and is on top of and contacting the bottom free layer of the bottom MTJ stack, and a metal write line that is sandwiched between and contacting the top and bottom heavy metal layers.

9. The semiconductor structure of claim 8, wherein the metal write line extends outward from the top MTJ stack and the bottom MTJ stack.

10. The semiconductor structure of claim 9, wherein an oxide layer covers a lower portion of the metal write line and an upper oxide layer covers an upper portion of the metal write line.

11. The semiconductor structure of claim 8, further comprising:
a bottom silicon nitride cap layer sheathing the bottom MTJ stack.

12. The semiconductor structure of claim 11, further comprising:
a top silicon nitride cap layer sheathing the top MTJ stack.

13. The semiconductor structure of claim 12, further comprising:
oxide layers encasing the top and bottom MTJ stacks and the metal write line.

14. A method for making a semiconductor structure, the method comprising:
forming a metallic bottom contact in a dielectric substrate;
forming a metallic bottom electrode on the dielectric substrate and contacting the metallic bottom contact;
forming a bottom magnetic tunnel junction (MTJ) stack on the metallic bottom electrode, wherein the bottom MTJ stack comprises a bottom fixed layer, a bottom tunnel barrier layer, and a bottom free layer;

forming a shared spin-Hall effect (SHE) rail on the bottom MTJ stack, wherein the SHE rail comprises a bottom heavy metal layer, a dielectric layer, and a top heavy metal layer;

producing a first precursor structure by forming a top MTJ stack on the SHE rail, wherein the top MTJ stack comprises a top free layer, a top tunnel barrier layer, and a top fixed layer;

producing a second precursor structure by ion beam etching sides of the first precursor, the second precursor having:

the bottom heavy metal layer with a same width as the bottom free layer of the bottom MTJ stack; and the top heavy layer of the SHE rail with a same width as the top free layer of the top MTJ stack; and producing an eighth precursor structure by partially etching the dielectric layer such that distal ends of the top heavy metal layer and the bottom heavy metal layer extend beyond distal ends of the dielectric layer.

15. The method of claim 14, wherein producing the second precursor structure includes ion beam etching down to the dielectric substrate.

16. The method of claim 15, further comprising:

producing a third precursor structure by depositing a silicon nitride cap layer onto the second precursor structure.

17. The method of claim 16, further comprising producing a fourth precursor structure by:

depositing an oxide layer onto the third precursor structure;

chemical-mechanical planarization; and etch back of the oxide layer.

18. The method of claim 17, further comprising:

producing a fifth precursor structure by etch and strip of the silicon nitride cap down to the oxide layer.

19. The method of claim 18, further comprising:

producing a sixth precursor structure by deposition and etch back of amorphous silicon (a-Si) onto the fifth precursor structure.

20. The method of claim 19, further comprising:

producing a seventh precursor structure by deposition and etch back of a second silicon nitride cap layer onto the sixth precursor structure.

* * * * *